US006878972B2

(12) United States Patent
Waalib-Singh et al.

(10) Patent No.: US 6,878,972 B2
(45) Date of Patent: Apr. 12, 2005

(54) LIGHT-EMITTING DIODE WITH PLASTIC REFLECTOR CUP

(75) Inventors: Nirmal K Waalib-Singh, Strathfield (AU); Zainal Fiteri-Aziz, Penang (MY); Marcus Chi-Yuen Wong, Penang (MY)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 10/164,998

(22) Filed: Jun. 7, 2002

(65) Prior Publication Data

US 2003/0001166 A1 Jan. 2, 2003

(30) Foreign Application Priority Data

Jun. 8, 2001 (MY) ...................................... PI 20012676

(51) Int. Cl.[7] .............................................. H01L 33/00
(52) U.S. Cl. ............................ 257/98; 257/81; 257/82; 257/95; 257/99; 257/100; 257/432; 257/433
(58) Field of Search ........................... 257/81, 82, 432, 257/433, 723, 724, 777

(56) References Cited

U.S. PATENT DOCUMENTS

| | | | | |
|---|---|---|---|---|
| 4,375,606 A | * | 3/1983 | Di Leo et al. .............. | 313/499 |
| 5,998,232 A | * | 12/1999 | Maruska ...................... | 438/46 |
| 6,341,899 B1 | * | 1/2002 | Shirakawa et al. ........... | 385/88 |
| 6,395,201 B1 | * | 5/2002 | Hunt et al. .................. | 264/1.9 |
| 6,483,196 B1 | * | 11/2002 | Wojnarowski et al. ...... | 257/778 |
| 6,504,301 B1 | * | 1/2003 | Lowery ...................... | 313/512 |
| 6,518,600 B1 | * | 2/2003 | Shaddock .................... | 257/98 |

FOREIGN PATENT DOCUMENTS

| | | |
|---|---|---|
| JP | 61159436 | 7/1986 |
| JP | 02114194 | 4/1990 |

* cited by examiner

*Primary Examiner*—Hoai Pham
*Assistant Examiner*—Wai-Sing Louie

(57) ABSTRACT

A light-emitting diode comprising a light-emitting diode die, a lead frame, a reflector cup and a dome encapsulating at least the light-emitting diode die and the reflector cup, wherein the reflector cup is made of a plastic material.

15 Claims, 7 Drawing Sheets

LIGHT-EMITTING DIODE WITH PLASTIC REFLECTOR CUP

BACKGROUND OF THE INVENTION

1. Field of the Invention

The invention relates to a light-emitting diode.

2. Related Art

A typical light-emitting diode (LED) comprises a light-emitting diode die for emitting light and having a positive terminal and a negative terminal for electrically contacting the die, a lead frame comprising a positive lead frame portion and a negative lead frame portion, the positive lead frame portion being electrically coupled to the positive terminal and the negative lead frame portion being electrically coupled to the negative terminal, a reflector element, the reflector element being arranged to reflect light emitted from the light-emitting diode die away from the light-emitting diode die, and a dome encapsulating at least the light-emitting diode die and the reflector element, the dome being made of a material which is at least partially transparent for light emitted from the light-emitting diode die.

The LED die, when properly electrically contacted via the positive and the negative terminal, emits light.

The lead frame usually serves for electrically contacting the LED die to an outer circuitry such as a power supply and for mechanically mounting the entire LED. Therefore, the lead frame is usually made of an electrically conductive material such as a metal.

The reflector element is usually made of a metal. An inner surface of the reflector element faces the LED die. Light emitted from the LED die is incident on the metal inner surface and is reflected therefrom. The inner surface is shaped such that the incident light is reflected towards a desired direction.

The dome is usually molded from a resin such as epoxy resin. The dome serves to protect the LED die and the reflector against external influences, which could adversely influence the LED die and the reflector, e.g. by causing oxidation.

However, despite using the dome, oxidation of the metal reflector cannot entirely be prevented.

Japanese Patent Application No. 61159436 discloses a lead frame for a light-emitting diode. The lead frame comprises an incorporated upper portion intended to serve as a reflector element. The upper part comprises a silver plating, so as to improve the light emitting efficiency.

Japanese Patent Application No. 02114194 discloses a light-emitting diode having a massive molded reflector block element having an inner reflector surface having a nearly conical shape, so as to achieve the good light takeout efficiency.

SUMMARY OF THE INVENTION

According to the present invention, there is provided a light-emitting diode comprising:

a light-emitting diode die for emitting light and having a first terminal and a second terminal, a lead frame comprising a first lead frame portion and a second lead frame portion, the first lead frame portion being electrically coupled to the first terminal and the second lead frame portion being electrically coupled to the second terminal, a reflector cup comprising a body having an inner surface facing the light-emitting diode die and an outer surface facing outwards from the light-emitting diode die, the reflector cup being arranged to reflect light emitted from the light-emitting diode die away from the light-emitting diode die, and a dome encapsulating at least the light-emitting diode die and the reflector cup, the dome being made of a material which is at least partially transparent for light emitted from the light-emitting diode die, wherein the body of the reflector cup is made of a plastic material.

The use of a plastic material instead of a metal for the reflector body allows the fabrication of a reflector with surfaces having less and smaller surface asperities. By this the reflectivity of the surfaces is improved. Consequently the light output of the light-emitting diode is improved. Furthermore, since the reflector is designed to have the form of a cup meaning that its lateral wall has an at least partially and substantially paraboloid shape, instead of the form of a massive block, the light-emitting diode according to the invention has a light and easy-to-manufacture construction.

Preferably, the first terminal of the light-emitting diode is a positive terminal, and the second termincal of the light-emitting diode is a negative terminal.

DETAILED DESCRIPTION OF THE PREFERRED EMBODIMENTS OF THE INVENTION

In the following, a detailed description of preferred embodiments of the invention will be given, with reference to the accompanying drawings.

Figure 1:
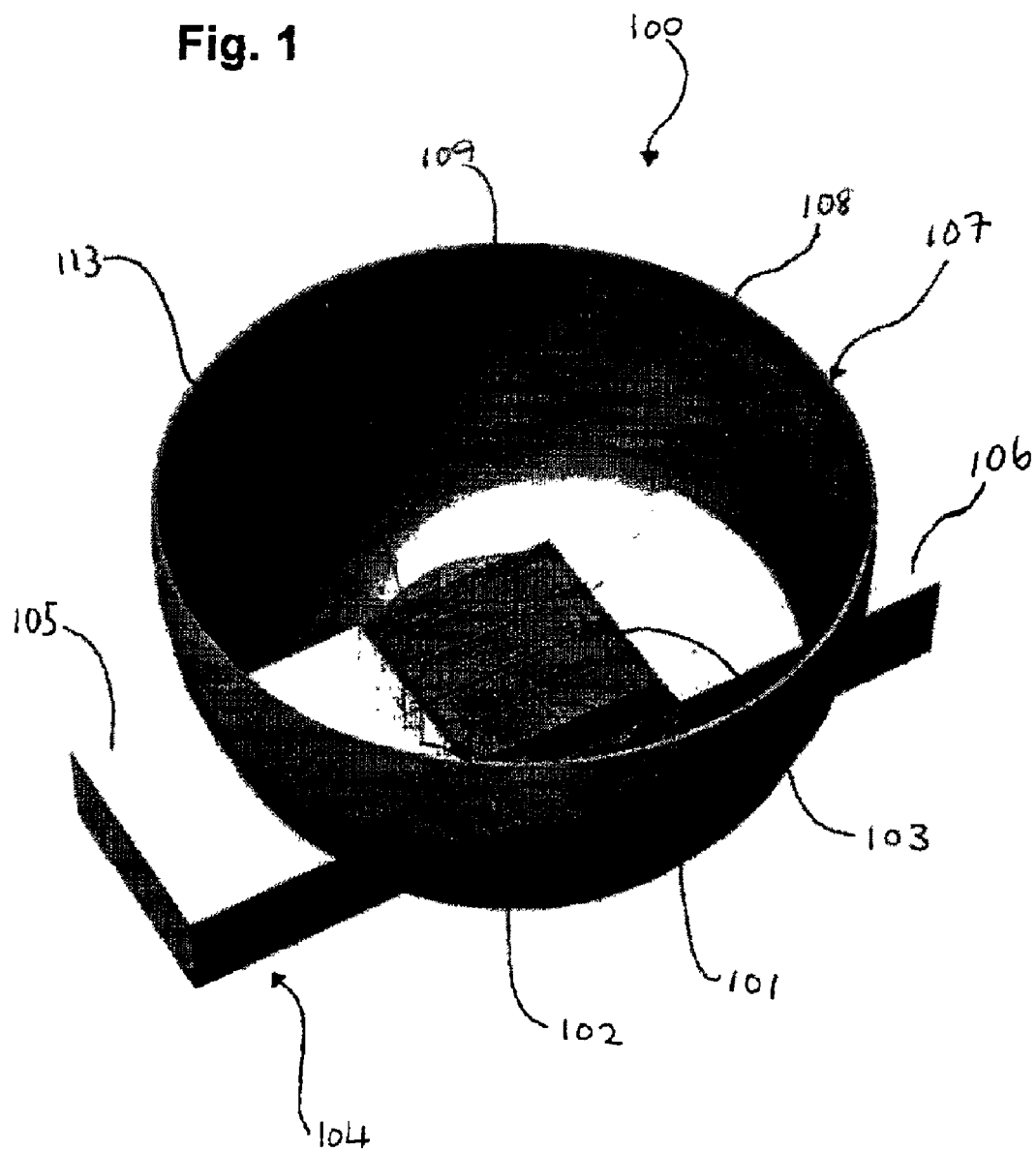
FIG. 1 shows a partial perspective view of a light-emitting diode according to a first embodiment of the present invention.

FIG. 1 shows a partial perspective view of a light-emitting diode 100 according to a first embodiment of the present invention.

The light-emitting diode 100 of FIG. 1 comprises a light-emitting diode die 101 for emitting light and having a positive terminal 102 and a negative terminal 103. Further, the light-emitting diode 100 comprises a lead frame 104 comprising a positive lead frame portion 105 and a negative lead frame portion 106. The positive lead frame portion 105 is electrically coupled to the positive terminal 102. The negative lead frame portion 106 is electrically coupled to the negative terminal 103. Further, the light-emitting diode 100 comprises a reflector cup 107 comprising a body 108 having an inner surface 109 facing the light-emitting diode die 101 and an outer surface 110 facing outwards from the light-emitting diode die 101. The reflector cup 107 is arranged to reflect light emitted from the light-emitting diode die 101 away from the light-emitting diode die 101. The body 108 of the reflector cup 107 is made of a plastics material.

Preferably, the body 108 of the reflector cup 107 is made of a liquid crystal polymer by thermoplastic injection molding at a temperature of typically 400° C. However, the body 108 of the reflector cup 107 can also be made of a different molded plastics material.

As further shown in FIG. 1, a lateral wall 113 of the reflector body 108 is of at least substantially paraboloid shape, wherein the inner surface 109 and the outer surface 110 of the lateral wall 113 extend generally parallel, so that the wall 113 of the reflector cup 107 is delimited by the inner surface 109 and the outer surface 110. According to this preferred embodiment of the invention, an average thickness of the wall 113 is small as compared to an average diameter of the reflector cup 107. By this, the reflector cup 107 has a shape of a thin-walled cup. With this configuration, either or both of the inner surface 109 and the outer surface 110 can be used to reflect the light emitted from the light-emitting diode die 101.

According to a first embodiment, the light emitted from the light-emitting diode die 101 is reflected from a reflective surface provided by the smooth plastic inner surface 109 of the reflector cup 107.

According to a variation of the first embodiment, a reflective coating for reflecting light emitted from the light-emitting diode die 101 is formed on the body 107 of the reflector cup 107.

Preferably, the reflective coating is made of aluminum. Also, the reflective coating can be made of some other metal, such as silver or gold.

According to a first variation, the reflective coating is formed on the inner surface 109 of the body 108 of the reflector cup 107. In this case, the light emitted from the light-emitting diode die 101 is reflected from a reflective surface provided by an outer surface of the reflective coating on the inner surface 109 of the reflector cup 107.

According to a preferred second variation, the reflective coating is formed on the outer surface 110 of the body 108 of the reflector cup 107. In this case, the light emitted from the light-emitting diode die 101 is reflected from a reflective surface provided by an inner surface of the reflective coating on the outer surface 110 of the reflector cup 107.

According to this preferred second variation of the invention, since the reflective surface is provided by an inner surface of the reflective coating, the reflective surface is protected by the body 108 of the reflector cup 107. Accordingly, once the reflective coating is coated on the body 108, the reflective surface thereof is not exposed to air and thereby to oxidation. Consequently, a deterioration of the reflective quality of the reflective surface of the reflector cup 107 can be prevented even in the time period between manufacturing of the reflector cup 107 and assembling the same into the light-emitting device.

It will be understood by those skilled in the art that in this preferred second variation of the invention the outer shape of the reflector cup 107 carrying the reflective coating is of primary importance in order to achieve a proper reflection. Accordingly, the lateral wall 113 of the reflector cup 107 should have an at least substantially paraboloid outer surface, whereas the inner surface thereof may have a different shape.

The positive terminal 102 and the negative terminal 103 can be formed on different sides of the light-emitting diode die 101, In this case, one terminal of the positive terminal 102 and the negative terminal 103 can be directly contacted to the corresponding lead frame portion 105 or 106, respectively, and the other terminal has to be electrically coupled to the remaining lead frame portion 106 or 105. The element used for this electrical coupling may partially extend inside a space surrounded by the reflector cup 107. The element is preferably a wire bond.

In the embodiment of the invention shown in FIG. 1, the positive terminal 102 and the negative terminal 103 are formed on the same side of the light-emitting diode die 101. This construction has the advantage that both terminals 102, 103 can be electrically contacted to the lead frame portions 105, 106, without having wires or the like passing through the space defined by the reflector cup 107. Therefore, said construction increases the light output of the light-emitting diode 100.

Further, in the embodiment of the invention shown in FIG. 1, the positive terminal 102 and the negative terminal 103 are each formed as a solder joint, wherein the light-emitting diode die 101 is clamped into the lead frame 104 so as to generate a mechanical and electrical connection between the die 101 and the lead frame 104.

Figure 2:
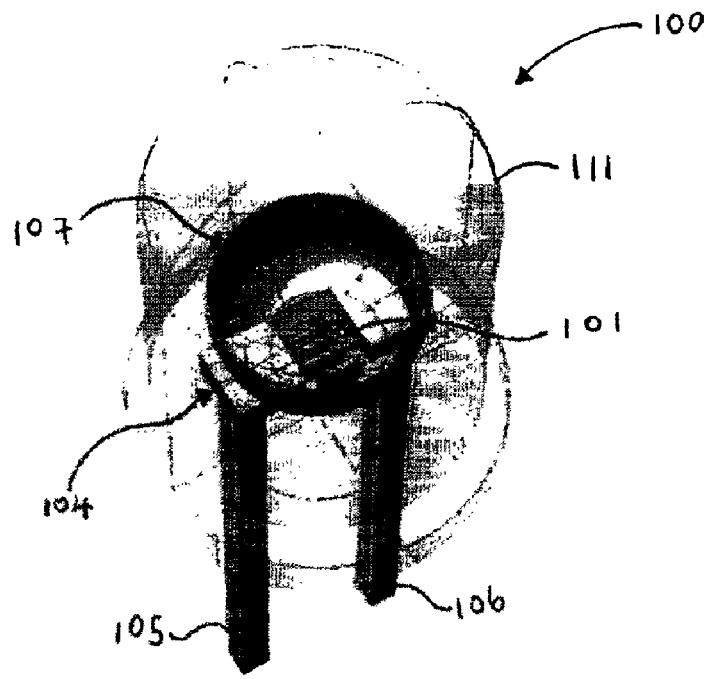
FIG. 2 shows a further perspective view of the light-emitting diode partially shown in FIG. 1.

FIG. 2 shows a further perspective view of the light-emitting diode 100 partially shown in FIG. 1.

Referring to FIG. 2, the light-emitting diode 100 according to the first embodiment of the invention further comprises a dome 111 encapsulating the light-emitting diode die 101, the reflector cup 107 and part of the lead frame 104. The dome 111 is made of a material which is at least partially transparent to light emitted from the light-emitting diode die 101. For example, the material may be an epoxy resin.

Figure 3:
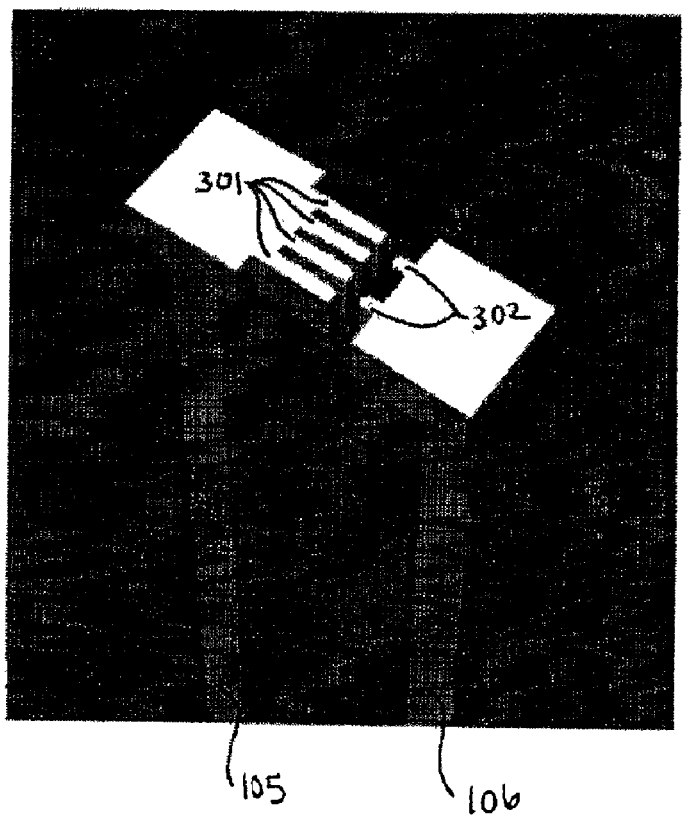
FIG. 3 shows a detailed perspective view of a lead frame of the light-emitting diode of FIG. 2.

FIG. 3 shows a detailed perspective view of a lead frame of the light-emitting diode of FIG. 2.

As shown in FIG. 3, the positive lead frame portion 105 comprises a plurality of contact fingers 301 at an end facing the light-emitting diode die 101 and the negative lead frame portion 106 comprises a plurality of contact fingers 302 at an end facing the light-emitting diode die 101, respectively for contacting the light-emitting diode die 101. The structure of the contact fingers 301, 302 corresponds to the terminals 102, 103 of the light-emitting diode die 101.

Figure 4:
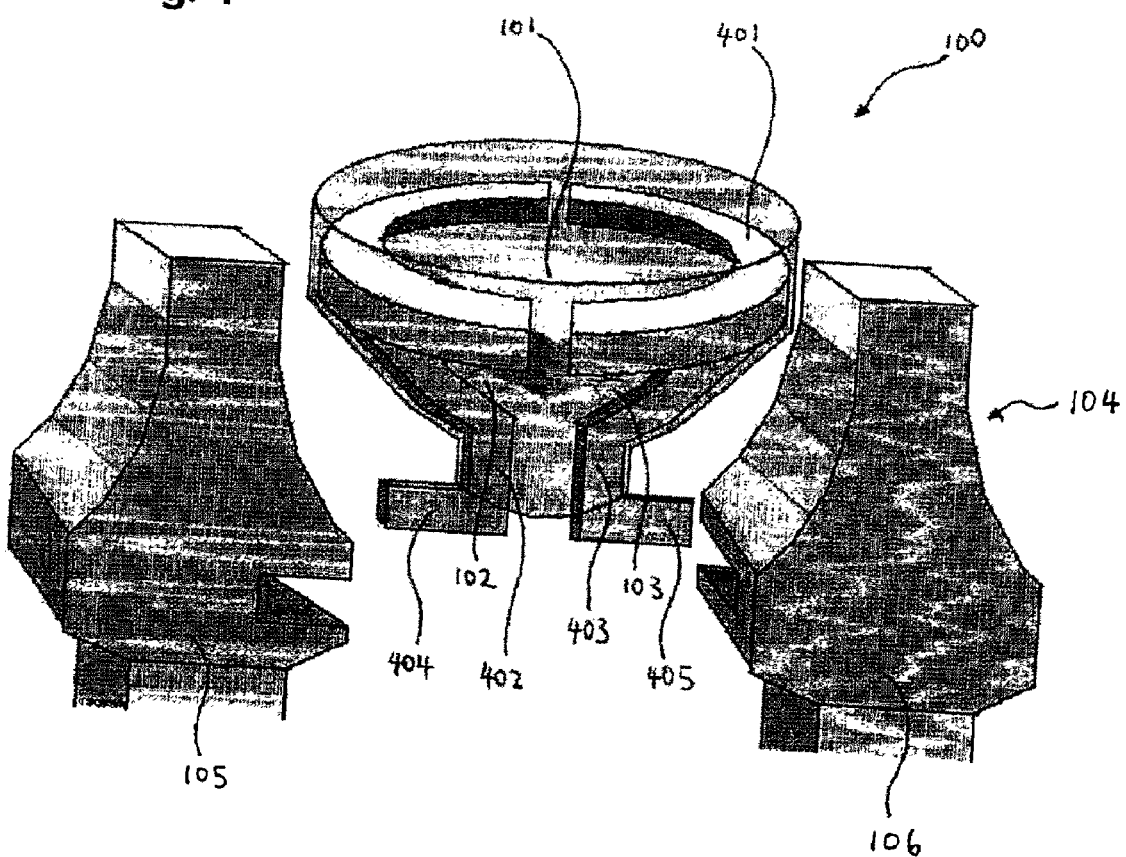
FIG. 4 shows a partially exploded partial perspective view of a light-emitting diode according to a second embodiment of the present invention.

FIG. 4 shows a partially exploded partial perspective view of a light-emitting diode 100 according to a second embodiment of the present invention.

In this second embodiment of the invention, the light-emitting diode 100 further comprises an inner frame 401 comprising a positive inner frame portion 402 and a negative inner frame portion 403. The positive inner frame portion 402 is electrically coupled between the positive terminal 102 and the positive lead frame portion 105, and the negative inner frame portion 403 is electrically coupled between the negative terminal 103 and the negative lead frame portion 106. The positive inner frame portion 402 comprises a positive locking member 404, by means of which the positive inner frame portion 402 is clamped to the positive lead frame portion 105 so as to generate a mechanical and electrical connection between the positive inner frame portion 402 and the positive lead frame portion 105. The negative inner frame portion 403 comprises a negative locking member 405, by means of which the negative frame portion 403 is clamped to the positive lead frame portion 106 so as to generate a mechanical and electrical connection between the negative inner frame portion 403 and the positive lead frame portion 106.

The positive terminal 102 and the negative terminal 103 are formed on the same side of the light-emitting diode die 101 and are each formed as a solder joint. The light-emitting diode die 101 is clamped into the inner frame 401 so as to generate a mechanical and electrical connection between the die 101 and the inner frame 401.

Figure 5:
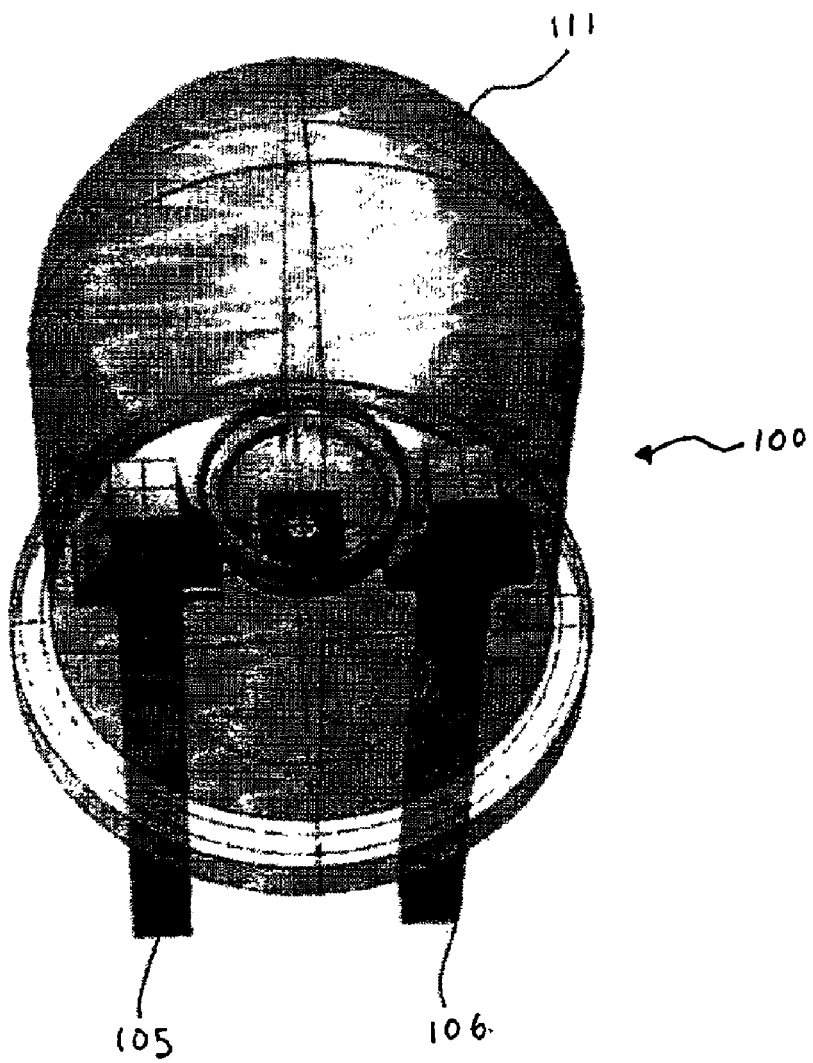
FIG. 5 shows a perspective view of the light-emitting diode partially shown in FIG. 4, in an assembled state.

FIG. 5 shows a perspective view of the light-emitting diode 100 partially shown in FIG. 4, in an assembled state, encapsulated in a dome 111, out of which the positive lead frame portion 105 and the negative lead frame portion 106 extend.

Figure 6A:
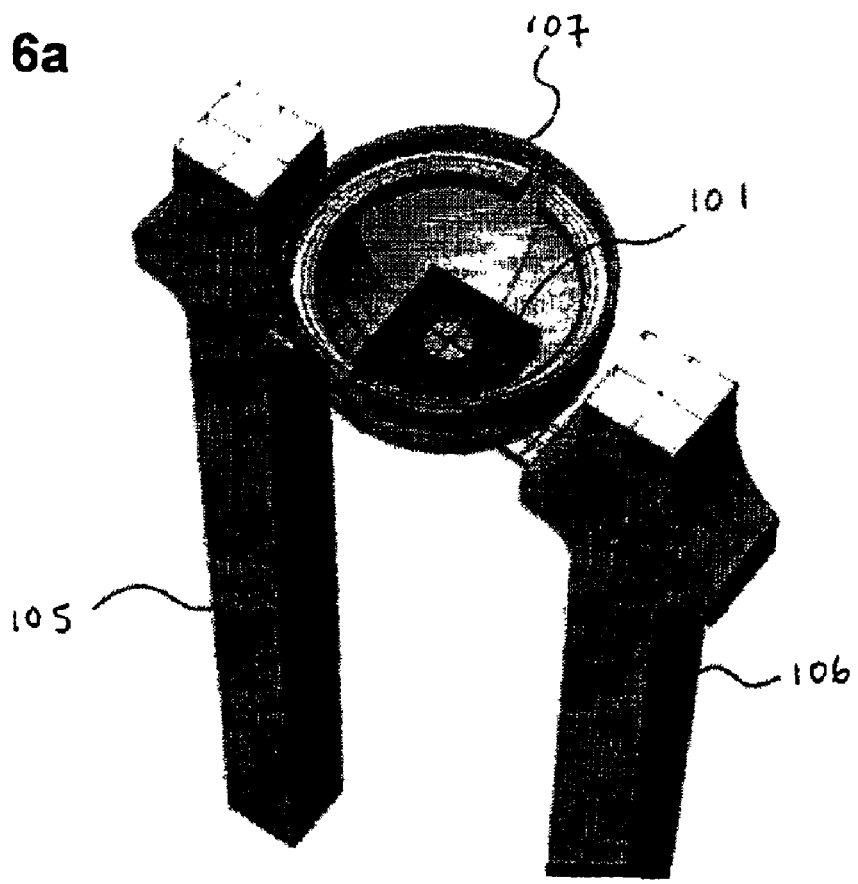
FIG. 6a shows a detailed perspective view of a central portion of the light-emitting diode of FIG. 5.
Figure 6B:
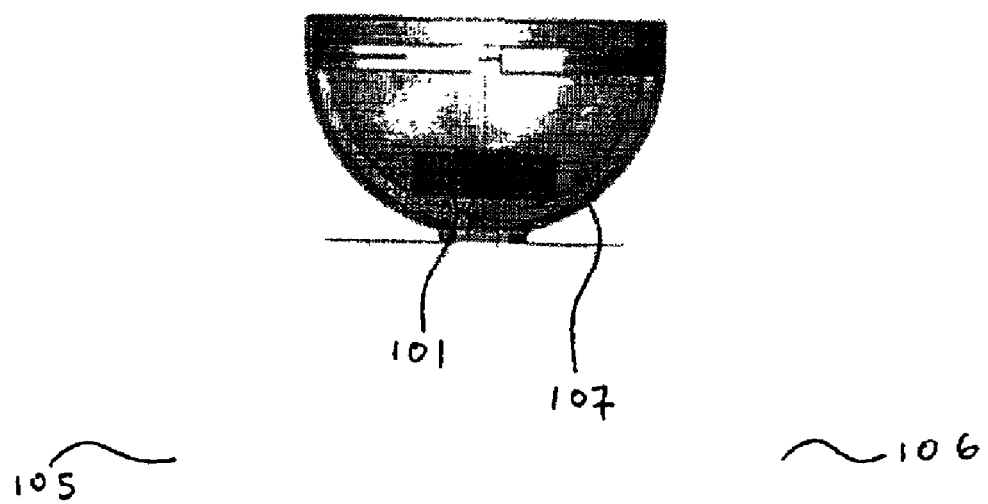
FIG. 6b shows a detailed side view of a central portion of the light-emitting diode of FIG. 5.

FIGS. 6a and 6b show respectively a detailed perspective view and a side view of a central portion of the light-emitting diode 100 of FIG. 5. FIGS. 6a and 6b particularly show the reflector cup 107 and the light-emitting diode die 101 positioned at a center bottom portion of the reflector cup 107, as well as the positive lead frame portion 105 and the negative lead frame portion 106.

In the above-described embodiments of the present invention, the positive lead frame portion 105 and the negative lead frame portion 106 extend in a direction extending generally parallel with respect to a direction of strongest emission of the light-emitting diode die 101.

Figure 7:
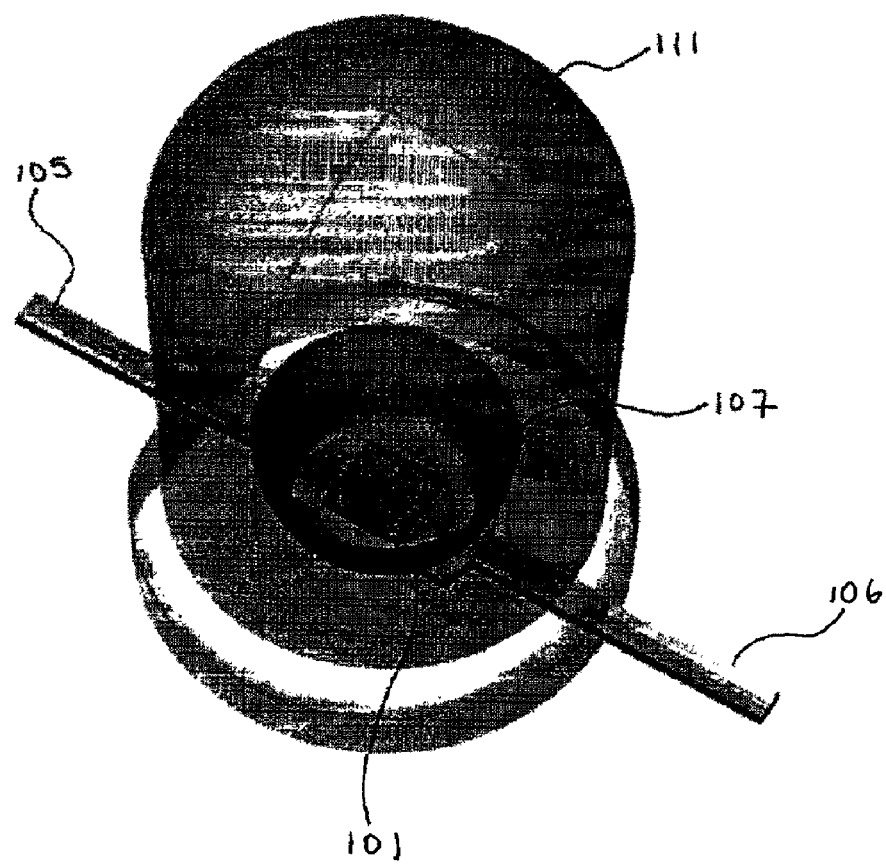
FIG. 7 shows a perspective view of a light-emitting diode according to a third embodiment of the present invention.

FIG. 7 shows a perspective view of a light-emitting diode 100 according to a third embodiment of the present invention.

In this third embodiment of the present invention, the positive lead frame portion 105 and the negative lead frame portion 106 extend in a direction extending generally perpendicular with respect to a direction of strongest emission of the light-emitting diode die 101.

Figure 8:
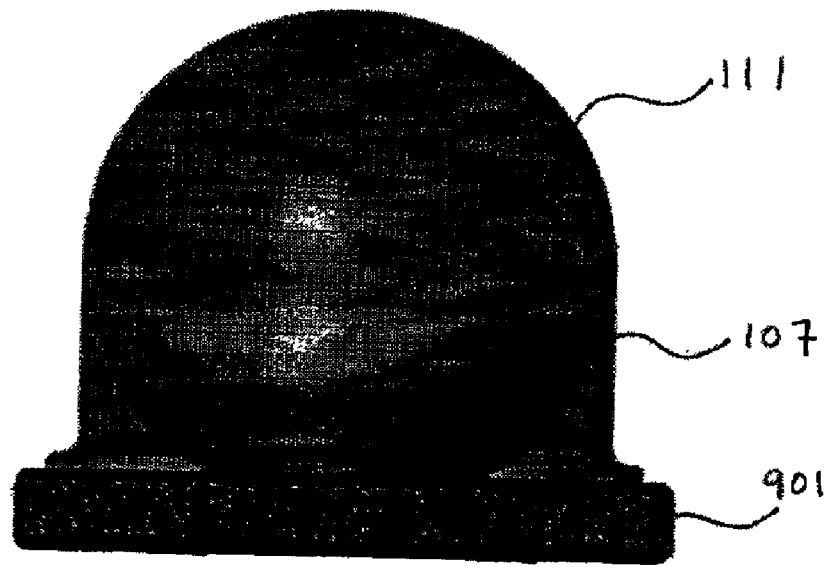
FIG. 8 shows a side view of a light-emitting diode according to a fourth embodiment of the present invention.

FIG. 8 shows a side view of a light-emitting diode 100 according to a fourth embodiment of the present invention. In this fourth embodiment of the present invention, the light-emitting diode die 101 is mounted on a printed circuit board 901.

Figure 9:
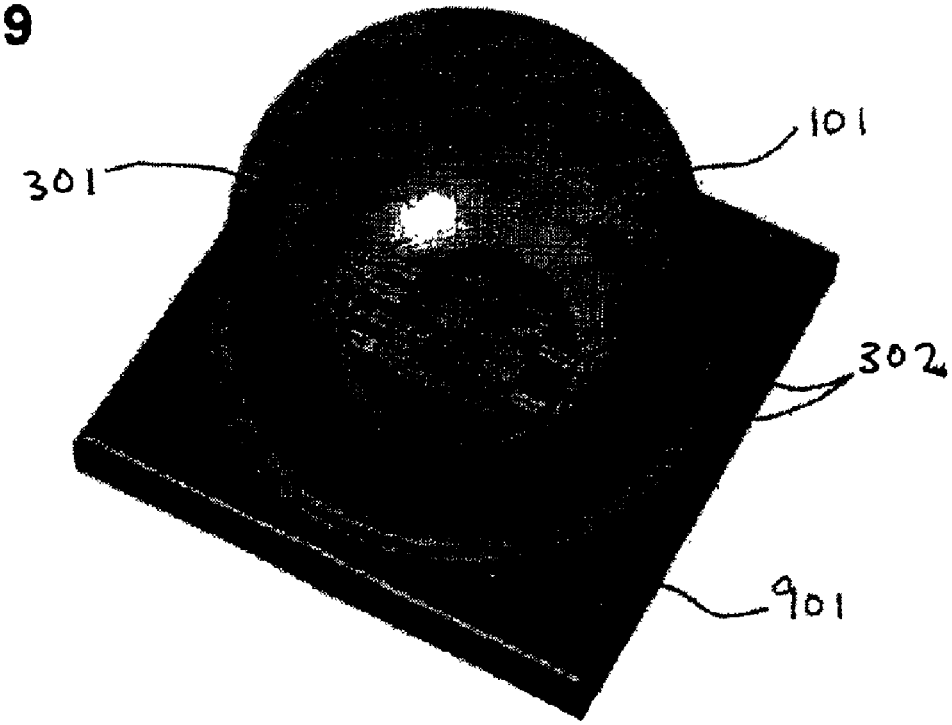
FIG. 9 shows a top perspective view of the light-emitting diode of FIG. 8.

FIG. 9 shows a top perspective view of the light-emitting diode 100 of FIG. 8. The light-emitting diode die 101 is mounted on the printed circuit board 901. The printed circuit board 901 comprises a plurality of contact fingers 301, 302 printed thereon, wherein the structure of the contact fingers 301, 302 is designed to match the structure of the terminals 102, 103 of the light-emitting diode die 101.

What is claimed is:

1. A light-emitting diode comprising:
   a light-emitting diode die for emitting light and having a first terminal and a second terminal,
   a lead frame comprising a first lead frame portion and a second lead frame portion, the first lead frame portion being electrically coupled to the first terminal and the second lead frame portion being electrically coupled to the second terminal,
   a reflector cup comprising a body made of a plastic material having an inner surface facing the light-emitting diode die and an outer surface facing outwards from the light-emitting diode die, the reflector cup being arranged to reflect light emitted from the light-emitting diode die away from the light-emitting diode die, and
   a dome encapsulating at least the light-emitting diode die and the reflector cup, the dome being made of a material which is at least partially transparent for light emitted from the light-emitting diode die.

2. The light-emitting diode according to claim 1, wherein the inner surface and the outer surface extend generally parallel to one another, so that a wall of the reflector cup is delimited by the inner surface and the outer surface, wherein said reflector cup has a circular cross-section and wherein an average thickness of the wall is small as compared to an average diameter of the reflector cup.

3. The light-emitting diode according to claim 1, wherein a reflective coating for reflecting light emitted from the light-emitting diode die is formed on the body of the reflector cup.

4. The light-emitting diode according to claim 3, wherein the reflective coating is formed on the inner surface of the body of the reflector cup.

5. The light-emitting diode according to claim 3, wherein the reflective coating is formed on the outer surface of the body of the reflector cup.

6. The light-emitting diode according to claim 3, wherein the reflective coating is made of a material comprising a metal such as aluminum.

7. The light-emitting diode according to claim 1, wherein the first terminal and the second terminal are formed on the same side of the light-emitting diode die.

8. The light-emitting diode according to claim 1, wherein the first terminal and the second terminal are each formed as a solder joint and wherein the light-emitting diode die is clamped into the lead frame so as to generate a mechanical and electrical connection between the die and the lead frame.

9. The light-emitting diode according to claim 1, further comprising an inner frame comprising a first inner frame portion and a second inner frame portion,
   wherein the first inner frame portion is electrically coupled between the first terminal and the first lead frame portion, and wherein the second inner frame portion is electrically coupled between the second terminal and the second lead frame portion, and
   wherein the first inner frame portion comprises a first locking member, by means of which the first inner frame portion is clamped to the first lead frame portion so as to generate a mechanical and electrical connection between the first inner frame portion and the first lead frame portion, and wherein the second inner frame portion comprises a second locking member, by means of which the second inner frame portion is clamped to the second lead frame portion so as to generate a mechanical and electrical connection between the second inner frame portion and the second lead frame portion.

10. The light-emitting diode according to claim 1, wherein the first lead frame portion comprises a plurality of contact fingers at an end facing the light-emitting diode die and the second lead frame portion comprises a plurality of contact fingers at an end facing the light-emitting diode die, respectively for contacting the light-emitting diode die.

11. The light-emitting diode according to claim 1, wherein the first lead frame portion and the second lead frame portion extend in a direction extending generally parallel with respect to a direction of strongest emission of the light-emitting diode die.

12. The light-emitting diode according to claim 1, wherein the first lead frame portion and the second lead frame portion extend in a direction extending generally perpendicular with respect to a direction of strongest emission of the light-emitting diode die.

13. The light-emitting diode according to claim 1, wherein the light-emitting diode die is mounted on a printed circuit board.

14. The light-emitting diode according to claim 1, wherein the first terminal is a positive terminal, and the second terminal is a negative terminal.

15. A light-emitting diode comprising:

a light-emitting diode for emitting light and having a first terminal and a second terminal, a lead frame comprising a first lead frame portion and a second lead frame portion, the first lead frame portion being electrically coupled to the first terminal and the second lead frame portion being electrically coupled to the second terminal, a reflector comprising a body having an inner surface facing the light-emitting diode die and an outer surface facing off the light-emitting diode die, the reflector being arranged to reflect light emitted from the light-emitting diode die, and a dome encapsulating at least the light-emitting diode die and the reflector, the dome being made of a material which is at least partially transparent for light emitted from the light-emitting diode die, wherein the body of the reflector is made of a plastic material, and the outer surface of the body of the reflector is coated with a reflective coating and shaped so that the reflective coating coated thereon reflects light emitted from the light-emitting diode die away from the light-emitting diode die.

* * * * *